(12) United States Patent
Yoon et al.

(10) Patent No.: US 6,393,696 B1
(45) Date of Patent: May 28, 2002

(54) METHOD FOR MANUFACTURING PRINTED CIRCUIT BOARD

(75) Inventors: Kyung-Ro Yoon, Daejeon-si; Keon-Yang Park; Byung-Kook Sun, both of Seoul, all of (KR)

(73) Assignee: Samsung Electro-Mechanics Co., Ltd., Kyungki-do (KR)

(*) Notice: Subject to any disclaimer, the term of this patent is extended or adjusted under 35 U.S.C. 154(b) by 0 days.

(21) Appl. No.: 09/469,795

(22) Filed: Dec. 21, 1999

(30) Foreign Application Priority Data

Dec. 23, 1998 (KR) .............................. 98-57637

(51) Int. Cl.[7] .............................. H05K 3/36
(52) U.S. Cl. .............................. 29/830; 29/832; 29/852; 428/137
(58) Field of Search .................. 29/830, 832, 852; 438/901, 209, 830; 216/51, 95, 94

(56) References Cited

U.S. PATENT DOCUMENTS

| | | | | |
|---|---|---|---|---|
| 4,465,727 A | * | 8/1984 | Fuji et al. ............ | 428/138 |
| 5,106,461 A | * | 4/1992 | Volfson ............... | 205/125 |
| 5,695,859 A | * | 12/1997 | Burgess ............... | 428/209 |
| 5,886,615 A | * | 3/1999 | Burgess ............... | 338/114 |
| 6,090,468 A | * | 7/2000 | Shimada et al. ........ | 428/137 |

FOREIGN PATENT DOCUMENTS

| | | | |
|---|---|---|---|
| EP | 0412323 | * | 7/1990 |
| EP | 0552984 | * | 1/1993 |
| JP | 59-172295 | * | 9/1984 |
| JP | 60-257196 | * | 12/1995 |

\* cited by examiner

Primary Examiner—Lee Young
Assistant Examiner—Sean Smith
(74) Attorney, Agent, or Firm—Renner, Otto, Boisselle & Sklar, LLP

(57) ABSTRACT

A method for manufacturing a printed circuit board is disclosed. When a metal is plated on an upper board to form a circuit, bonding fingers for being bonded with a semiconductor chip are prevented from being electroplated with a metal. That is, a slot with an ink layer formed therein is formed in each of a plurality of boards. Then window regions of different sizes are defined, and a working is carried out on the portion where the slots are not formed. That is, the copper clad laminates are subjected to a working to form slots, and an ink layer is formed within each of the slots. In this manner, during the plating of the upper face of the printed circuit board, the metal is prevented from intruding into the window region, thereby preventing the formation of a short circuit.

17 Claims, 3 Drawing Sheets

METHOD FOR MANUFACTURING PRINTED CIRCUIT BOARD

BACKGROUND OF THE INVENTION

1. Field of the Invention

The present invention relates to a method for manufacturing a printed circuit board. Particularly, the present invention relates to a method for manufacturing a packaging type multi-layer printed circuit board, in which in a multi-layer printed circuit having a window region for installing a semiconductor chip, when a metal is plated on an upper board to form a circuit, bonding fingers for being bonded with the semiconductor chip are prevented from being electroplated with a metal.

2. Description of the Prior Art

Recently, according as the high density integrated circuit chips are made to have a high speed and a high function, the circuit board for installing the semiconductor chips has to have a high speed and a high function. Therefore, for the sake of a high speed and a high function, packaging type circuit boards (to directly install the semiconductor chips) are being proposed. Among these packaging type circuit boards, the chip-on-board type circuit board consisting of a plurality of can form a particularly high density circuit, and therefore, this board is calling for a particular attention.

FIG. 1 illustrates a conventional packaging type multi-layer printed circuit board for installing semiconductor chips. As shown in this drawing, this printed circuit board consists of a plurality of, with circuits formed thereon. Except a first copper clad lamina 1a which forms the bottom of the circuit board, other 1b, 1c and 1d form a window 4 into which a semiconductor chip 7 is to be installed.

In the above described printed circuit board, there are used both-side copper clad laminates(CCL). Accordingly, the copper cladding of the both faces of the CCLs 1a, 1b, 1c and 1d are etched to form circuits. Further, the CCLs 1a, 1b, 1c and 1d are coupled together by adhesive layers 2a, 2b and 2c which consist of prepreg. The CCLs 1a, 1b, 1c and 1d are different in their lengths. That is, the window for installing the semiconductor chip is different in its width at different CCLs, and therefore, when the CCLs 1a, 1b, 1c and 1d are coupled together, the window is formed in a multi-step shape.

Generally, the above described multi-layer printed circuit board is manufactured in the following manner. That is, the respective CCLs 1a, 1c, 1c and 1d are prepaid separately, and window regions are formed. Then the CCLs are coupled together by using the prepreg. Therefore, if the window 4 as shown in the drawings is to be formed, the window regions of the respective CCLs have to have different sizes.

In this manner, the window 4 is formed in a multi-step shape. Accordingly, parts of the second CCL 1b and the third CCL 1c are exposed to the outside. On the exposed portions of the second and third CCLs 1b and 1c, there are disposed copper or other metal layers 3a and 3b. These metal layers 3a and 3b are wire-bonded through a wire 10 to a pad 9 of the semiconductor chip 7, and therefore, the metal layers 3a and 3b are called "bond fingers".

The above described printed circuit board has an advantage such that the wire bonding between the circuit board and the semiconductor chip is done within the window. Therefore, the wire bonding is not exposed to the outside, and therefore, damages are not caused by external impacts or the like.

In the printed circuit board, there are formed through-holes 11. These through holes 11 are for electrically connecting the upper layers to the lowermost layer, and the insides of the through holes 11 are electroplated with a metal. Further, a metal is electroplated on the upper face of the lowermost layer, i.e., the fourth CCL 1d, thereby forming a circuit. Accordingly, when a metal is electroplated on the inside of the through hole 11 and on the upper face of the fourth CCL 1d, the metal is also plated within the window. Particularly, the metal is plated on the bonding fingers 3a and 3b, and therefore, the circuit is liable to be short-circuited so as to cause defects.

In order to prevent the short-circuiting upon plating the bonding fingers 3a and 3b, when plating a metal on the upper face of the fourth CCL 1d to form a circuit, the window has to be blocked, so that the metal cannot intrude into the window 4.

A method for preventing the intrusion of the metal into the window is illustrated in FIG. 2. As shown in FIG. 2, a dry film 15 is spread on the fourth CCL 1d before plating the metal. Accordingly, the metal is plated in a state with the window blocked, and therefore, the bonding fingers are not plated with the metal. However, the dry film 15 has a certain mass, and therefore, in the case where the dry film having a size of 16.7 mm×16.7 mm is spread on the window, the dry film is pulled downward due to its self gravity, with the result that the dry film is ruptured. In order to prevent this rupture, if the dry film is made thicker, then the formation of fine patterns becomes impossible due to the thick thickness.

In another proposal, there is a method of attaching a copper foil on the fourth CCL 1d to block the window. In this case, however, the overall treatment cost is increased due to the complication of the copper foil treatment and the etching treatment, thereby leading to the increase of the manufacturing cost.

SUMMARY OF THE INVENTION

The present invention is intended to overcome the above described disadvantages of the conventional techniques.

Therefore it is an object of the present invention to provide a method for manufacturing a printed circuit board, in which a plurality of boards are first worked to form a slot in each of them, then an ink layer is formed within the slot, then a metal is plated, and then, the boards are subjected to a second working, thereby preventing the plating of the metal on the semiconductor installing region.

In achieving the above object, the method for manufacturing a printed circuit board according to the present invention includes the steps of: forming a circuit on each of a plurality of boards; forming a slot in each of the plurality of the boards so as to form window regions having different sizes; filling an ink into the slots to form ink layers; coupling the plurality of the boards together to form a multi-layer circuit board; forming through-holes through the multi-layer circuit board, plating a metal, and etching it; treating the ink layer with a treatment solution such as sodium hydroxide to remove the ink layer; and removing the regions of the plurality of the boards where the slots are not formed, so as to form a multi-step window in the multi-layer printed circuit board.

A semiconductor chip is installed into the multi-step window, and bonding fingers are formed on the board to be wire-bonded to the semiconductor chip.

BRIEF DESCRIPTION OF THE DRAWINGS

The above object and other advantages of the present invention will become more apparent by describing in detail the preferred embodiment of the present invention with reference to the attached drawings in which.

DETAILED DESCRIPTION OF THE PREFERRED EMBODIMENT

The method for manufacturing the multi-layer printed circuit board according to the present invention will be described in detailed referring to the attached drawings. The reference codes which are same as those of the conventional method will be assigned with the same codes.

FIG. 3 illustrates the manufacturing process for the multi-layer printed circuit board according to the present invention. In the specification, the CCL is assumed to be used, but this is not meant that the present invention is limited to the CCL, but is only for the sake of the describing convenience.

Figure 1:
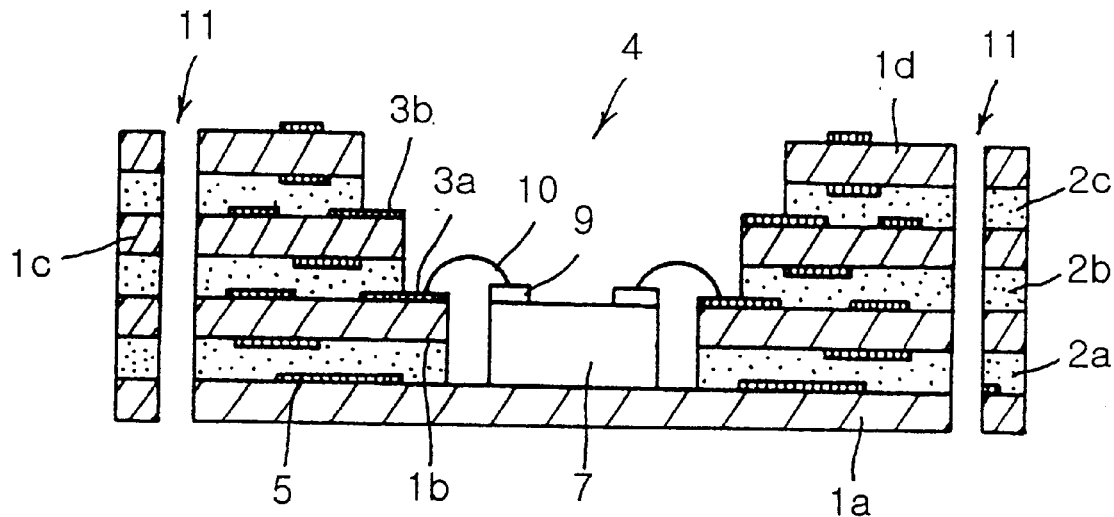
FIG. 1 illustrates a conventional packaging type multi-layer printed circuit board for installing semiconductor chips.
Figure 2:
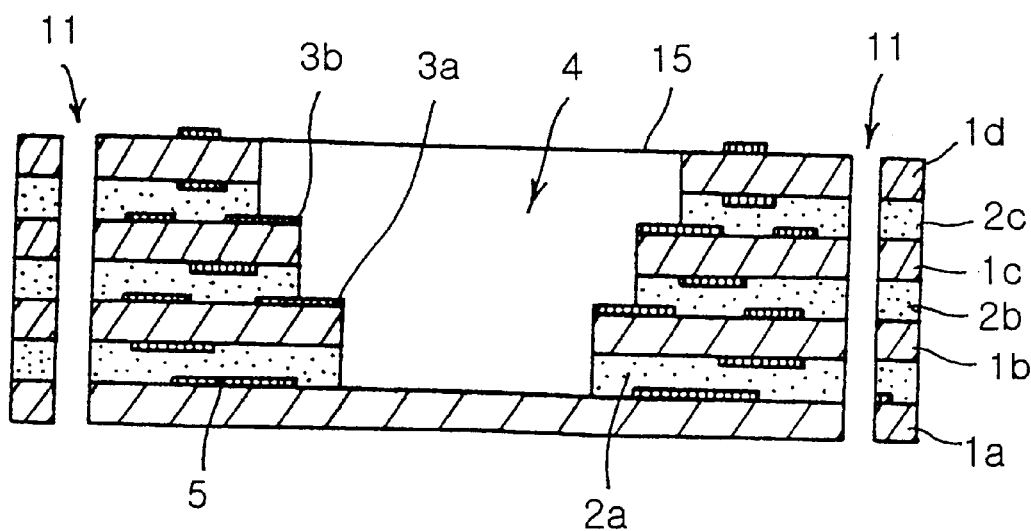
FIG. 2 illustrates the constitution of the conventional multi-layer printed circuit board.
Figure 3A:
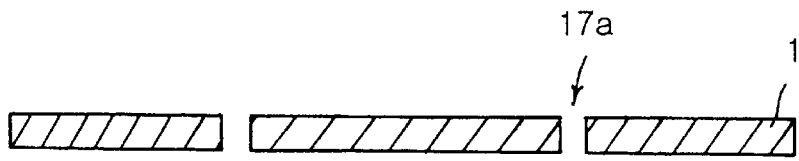
FIGS. 3a–3d illustrate the manufacturing process for the multi-layer printed circuit board according to the present invention.
Figure 3B:
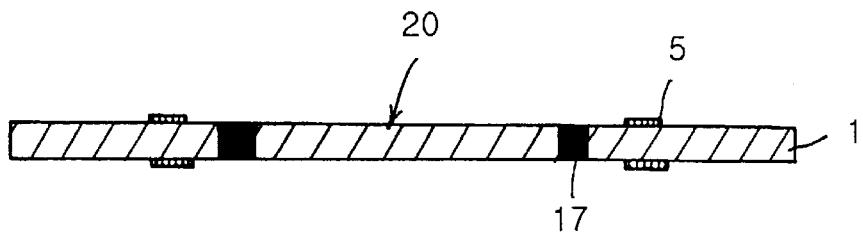

First, as shown in FIG. 3a, a CCL 1 is subjected to a first working to form a slot 17a. Then as shown in FIG. 3b, an ink is filled into the slot 17a of the CCL 1. The formation of the slot 17a is carried out in each of the CCLs which form the multi-layer printed circuit board.

Figure 4:
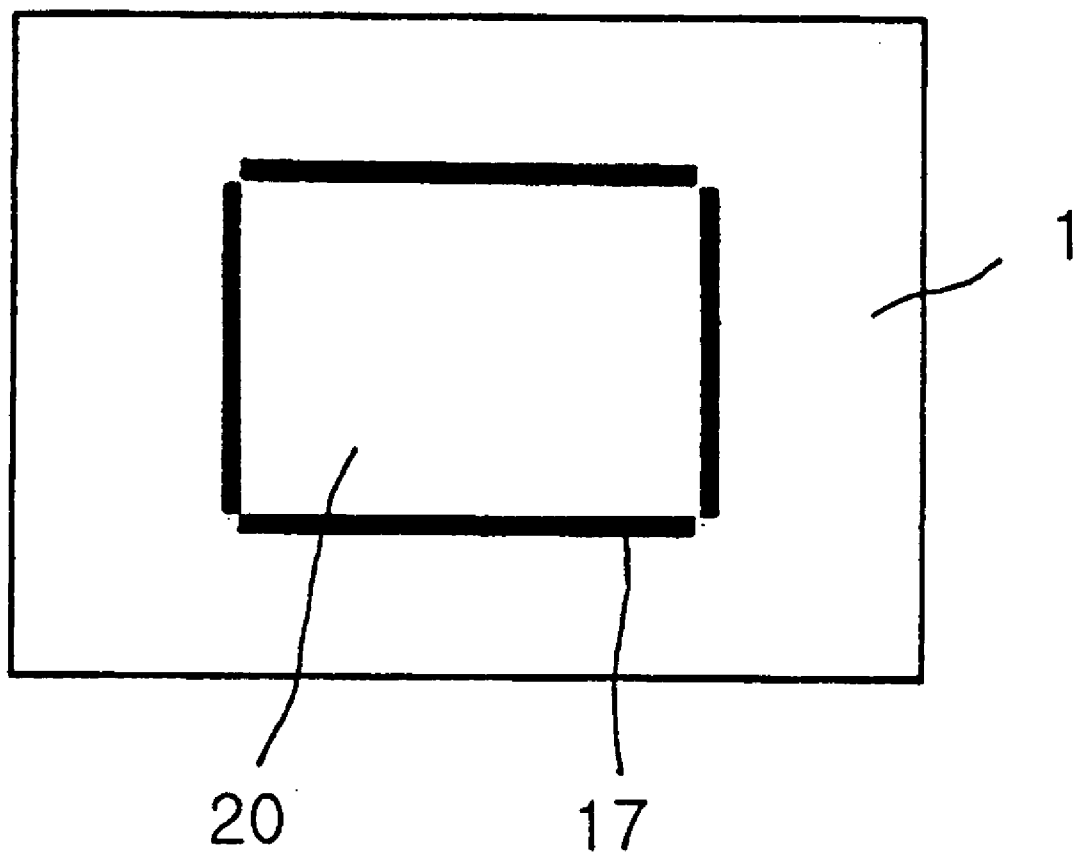
FIG. 4 is a plan view of FIG. 3b.

The board with the slot formed therein is illustrated in FIG. 4. As shown in this drawing, each of the four slots forms an approximate square. The region 20 which is surrounded by the slot forms a window for installing a semiconductor chip, and this region will be removed.

Therefore, when a plurality of the CCLs 1 are prepared, the areas of the region 20 are made different, thereby forming a multi-step window. In the CCL 1, the slot 17a is formed mechanically by using the rauter bit or the like. The width of the slot 17a is about 0.2–3.2 mm, and the window region which is to be removed has an area of about 16.7 mm×16.7 mm. As coming down to the lower layers of the CCLs, so the areas of the region 20 become smaller, thereby forming a multi-step window. The region 20 of each of the CCLs 1 is supported to the four corner portions of each of the CCLs 1, where the slots are not formed.

An ink is filled into the slots 17a, and a drying is carried out at a temperature of 120–130° C. for 60–100 minutes to cure the ink, thereby forming an ink layer 17. When the upper face of the multi-layer printed circuit board is plated with a metal, the metal is prevented from intruding into the window owing to the presence of the ink layer 17.

Then as shown in FIG. 3b, the copper foil of the CCL 1 is etched to form a circuit 5. This circuit may serve as a pad electrically connected to the semiconductor chip when the window is formed.

After working on the CCL 1 as described above, a metal may be plated to form the circuit 5. In actual, however, a metal is plated on the CCL 1, then an etching is carried out to form a circuit 5, and then, the slot 17a is formed, this being more desirable. The reason is as follows. That is, in the case where the metal is plated after forming the slot 17a in the CCL 1, the inside of the slot 17a is plated with the metal, and therefore, the metal of the slot 17a has to be removed during the filling of the ink.

Figure 3C:
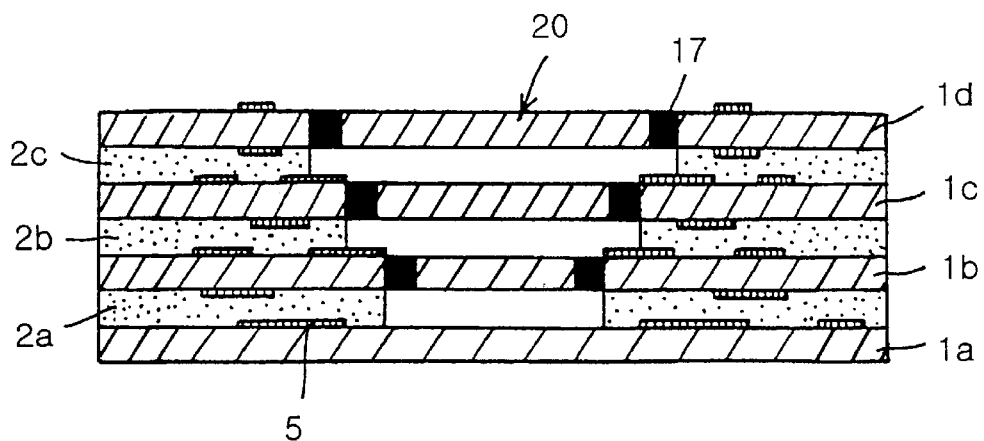

Then as shown in FIG. 3c, the CCLs 1a, 1b, 1c and 1d which have been worked as shown in FIGS. 3a and 3b are coupled together, after spreading adhesive layers 2a, 2b and 2c (consisting of prepreg) between them. Under this condition, the adhesive layers 2a, 2b and 2c consist of a high viscosity prepreg, so that the prepreg can be prevented from being flowed into the window region.

Each of the CCLs 1a, 1b, 1c and 1d has the circuit and the slot 17a which is filled with the ink. Accordingly, when the CCLs 1a, 1b, 1c and 1d are coupled together, the force imposed on the CCLs 1a, 1b, 1c and 1d is uniformly distributed over the CCLs 1a, 1b, 1c and 1d, and therefore, the coupling is done with a uniform strength. Alternatively, it is possible that the slot with the ink filled therein is formed only on the outermost CCL 1d, and the window regions are removed in the rest of the CCLs 1a, 1b and 1c.

Then the CCLs 1a, 1b, 1c and 1d and the adhesive layers 2a, 2b and 2c are drilled by using a mechanical means such as a drill, to form a through hole 11. Then a metal is plated on the inside of the through hole 11 and on the upper face of the fourth CCL 1d, and then, an etching is carried out, thereby forming the circuit 5. Thereafter, the ink layer 17 is removed by using a treatment solution such as sodium hydroxide (NaOH). In this manner, the slots 17a of an approximate square shape are formed on the CCLs 1a, 1b, 1c and 1d as shown in FIG. 4.

Figure 3D:
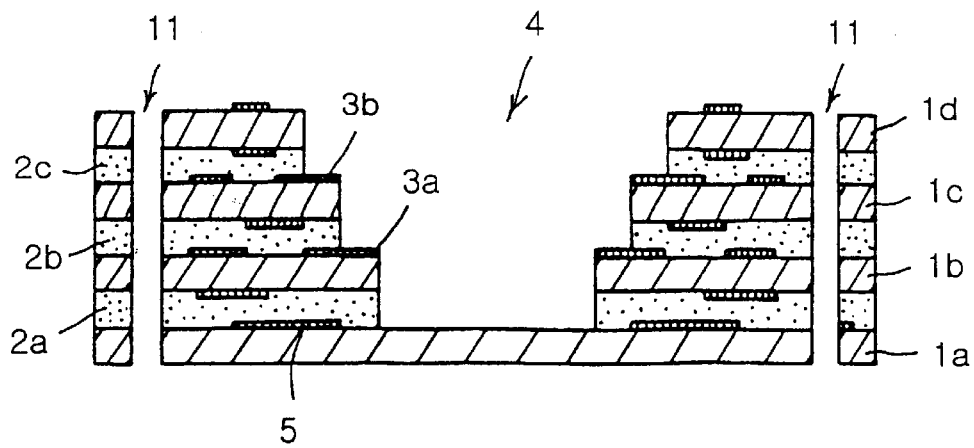

Then, the corner portions of the window region, i.e., the portions of the CCLs between the sot and the sot which have not been worked at the first working are subjected to a second working by using a mechanical means such as router, thereby removing the window region 20 of the CCL 1. In this manner, a window 4 is formed as shown in FIG. 3d. Thereafter, a semiconductor chip is installed into the window 4, and the bonding fingers 3a and 3b are bonded through wires to the pads of the semiconductor chip.

As described above, in the printed circuit board manufacturing method of the present invention, a slot 17a with a width of 0.2–3.2 mm is formed in each of the CCLs 1a, 1b, 1c and 1d. An ink is filled into the slot to form an ink layer 17, and therefore, when plating a metal on the printed circuit board, the metal is prevented from intruding into the window. The width of the slot is about 02–3.2 mm as described above, and therefore, the interior of the slot can be filled completely filled with the ink. Further, the ink is cured at a temperature of 120–130° C. for 60–100 minutes, and therefore, the ink cannot be leaked to the outside.

Unlike the method of the present invention, it is also possible that the CCLs with the window regions formed therein are coupled together, then the ink is filled into the window region, and then, the metal is plated. However, In this different method, the prepreg (although it has a high viscosity) of the CCLs 1a, 1b, 1c and 1d is leaked into the window region, and the ink is chemically reacted with the prepreg to be strongly bonded together. Accordingly, when removing the ink, the ink cannot be completely removed, but remains on the bonding fingers. As a result, a problem occurs in the electrical connection between the semiconductor chip and the printed circuit board. Therefore, the method of the present invention is preferable. That is, a slot is formed in each of the CCLs, and thus, the intrusion of the metal during the plating is prevented, this being the most efficient method.

According to the present invention as described above, when a metal is plated on an upper board to form a circuit, bonding fingers for being bonded with the semiconductor chip are prevented from being electroplated with a metal. This is, the metal is prevented from intruding into the multi-step window. That is, the CCL is subjected to a first working to form slots, and an ink layer is formed within each of the slots. In this manner, during the plating of the upper face of the printed circuit board, the metal is prevented from intruding into the window region. Then the CCL is subjected to a second working to form a window. Thus, the manufacturing method is simple, and the manufacturing cost is low.

What is claimed is:

1. A method for manufacturing a printed circuit board, comprising the steps of:

forming a circuit on each of a plurality of boards;

forming a slot in each of the plurality of said boards so as to define window regions having different sizes;

filling an ink into said slots to form ink layers;

attaching the plurality of said boards together, to form a multi-layer circuit boards;

forming through-holes through said multi-layer circuit board, plating a metal therein, and etching said metal;

removing said ink layers; and removing the regions of the plurality of said boards where said slots are not formed, so as to form a multi-step window in said multi-layer printed circuit board.

2. The method as claimed in claim 1, wherein said boards are copper clad laminate.

3. The method as claimed in claim 1, wherein said slot has a width of about 0.2–3.2 mm.

4. The method as claimed in claim 1, wherein said slot is formed by using a router.

5. The method as claimed in claim 1, wherein said boards are attached together by using a prepreg.

6. The method as claimed in claim 1, wherein the step of forming said ink layer comprises the sub-steps of:

filling an ink into said slots; and curing the ink.

7. The method as claimed in claim 6, wherein the ink is dried at a temperature of 120–130° C. for about 60–100 minutes to cure it.

8. The method as claimed in claim 1, wherein said ink layer is formed by using a treatment solution including sodium hydroxide.

9. A method for manufacturing a printed circuit board having multi-layers, comprising the steps of:

forming a circuit on each of a plurality of boards;

forming a window on a first board;

forming a plurality of slots in a second board to define a window region larger than said window;

forming an ink layer in each of the plurality of said slots of said second board;

attaching said first board and said second board together;

forming a through hole in each of said first and second boards, and plating a metal therein and etching said metal;

removing said ink layers from said slots; and removing a portion of said second board where slots are not formed, thereby forming a multi-step window.

10. The method as claimed in claim 9, wherein said first and second boards are copper clad laminate.

11. The method as claimed in claim 9, wherein said slot of said second board has a width of about 0.2–3.2 mm.

12. The method as claimed in claim 9, wherein said slot is formed by using a rauter.

13. The method as claimed in claim 9, wherein said first and second boards are attached together by using a prepreg.

14. The method as claimed in claim 9, wherein the step of forming said ink layer comprises the sub-steps of:

filling an ink into said slots; and curing the ink.

15. The method as claimed in claim 14, wherein the ink is dried at a temperature of 120–130° C. for about 60–100 minutes to cure it.

16. The method as claimed in claim 9, wherein said ink layer is removed by using a treatment solution including sodium hydroxide.

17. A method for manufacturing a printed circuit board, comprising the steps of:

forming a circuit on each of a plurality of boards;

forming a plurality of slots in the plurality of boards to form window regions of different sizes;

attaching the plurality of said boards together to form a multi-layer circuit board;

forming an ink layer in each of the plurality of said slots of said boards;

forming a through hole in each of the plurality of said boards, and plating a metal thereon and etching said metal;

removing said ink layers from said slots; and removing portions of the plurality of said boards where slots are not formed, thereby forming a multi-step window in said multi-layer printed circuit board.

* * * * *